United States Patent
Xu et al.

(10) Patent No.: US 8,912,039 B2
(45) Date of Patent: Dec. 16, 2014

(54) SEMICONDUCTOR DEVICE AND MANUFACTURING METHOD THEREOF

(71) Applicants: Semiconductor Manufacturing International Corporation, Shanghai (CN); Semiconductor Manufacturing International Corporation, Beijing (CN)

(72) Inventors: Jia Xu, Shanghai (CN); GuanPing Wu, Shanghai (JP); Daisy Liu, Shanghai (CN); Johnny Ren, Shanghai (JP)

(73) Assignees: Semiconductor Manufacturing International (Shanghai) Corporation (CN); Semiconductor Manufacturing International (Beijing) Corporation (CN)

( * ) Notice: Subject to any disclaimer, the term of this patent is extended or adjusted under 35 U.S.C. 154(b) by 34 days.

(21) Appl. No.: 13/691,533

(22) Filed: Nov. 30, 2012

(65) Prior Publication Data
US 2013/0168633 A1    Jul. 4, 2013

(30) Foreign Application Priority Data
Dec. 31, 2011   (CN) .......................... 2011 1 0459129

(51) Int. Cl.
*H01L 21/06*    (2006.01)
*H01L 45/00*    (2006.01)
*H01L 27/24*    (2006.01)

(52) U.S. Cl.
CPC .............. *H01L 45/06* (2013.01); *H01L 4/1266* (2013.01); *H01L 45/144* (2013.01); *H01L 45/1675* (2013.01); *H01L 27/2409* (2013.01)
USPC .............................................. 438/103; 257/5

(58) Field of Classification Search
CPC ........................... H01L 45/16; H01L 45/1226
USPC .................................. 438/54, 103; 257/626, 5
See application file for complete search history.

(56) References Cited

U.S. PATENT DOCUMENTS

| | | | | |
|---|---|---|---|---|
| 2007/0120105 A1* | 5/2007 | Chao et al. | | 257/3 |
| 2007/0258279 A1* | 11/2007 | Lung et al. | | 365/72 |
| 2008/0048213 A1* | 2/2008 | Liu | | 257/246 |

FOREIGN PATENT DOCUMENTS

| | | |
|---|---|---|
| CN | 1722488 A | 1/2006 |
| CN | 101529595 A | 9/2009 |

\* cited by examiner

*Primary Examiner* — Caridad Everhart
(74) *Attorney, Agent, or Firm* — Innovation Counsel LLP

(57) ABSTRACT

A device that may be used for a phase change random access memory in a semiconductor device and a manufacturing method thereof are provided. The device includes a phase change unit and two sidewall electrodes respectively located on two opposite sidewalls of the phase change unit. The phase change unit includes a three layer structure, in which a phase change material layer is positioned between a top insulating material layer and a bottom insulating material layer. The first sidewall electrode and the second sidewall electrode are in contact with two opposite end faces of the phase change material layer. The contact area between electrode and phase change material is reduced, thereby obtaining a relatively small drive current and meeting a demand that the integrated level of such a device is increasingly enhanced.

18 Claims, 10 Drawing Sheets

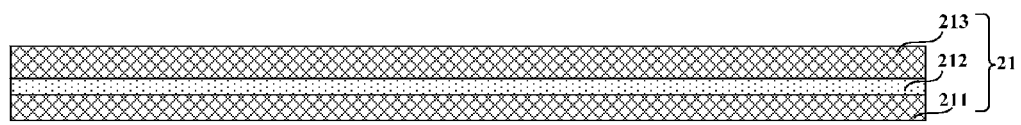
Fig.2A
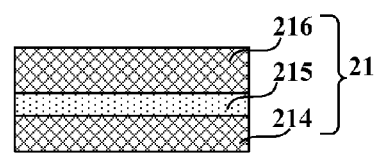
Fig.2B
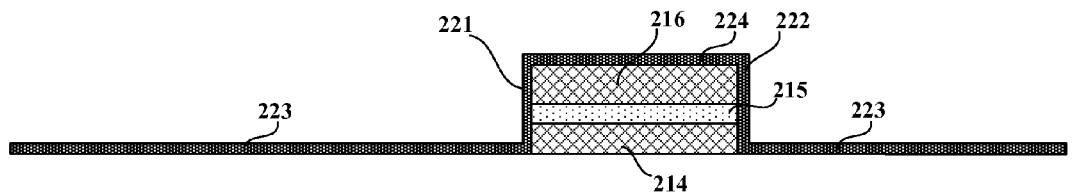
Fig.2C
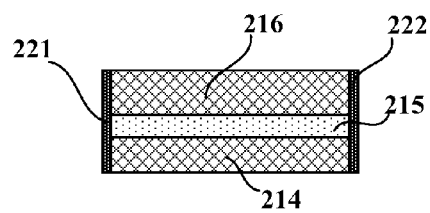 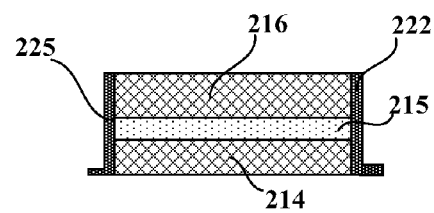
Fig.2D   Fig.2E

SEMICONDUCTOR DEVICE AND MANUFACTURING METHOD THEREOF

CROSS-REFERENCE TO RELATED APPLICATIONS

This application claims priority to Chinese Patent Application No. 201110459129.5, filed on Dec. 31, 2011 and entitled "Semiconductor Device and Manufacturing Method thereof", which is incorporated herein by reference in its entirety.

FIELD OF THE INVENTION

The present invention relates to the field of semiconductor techniques, and more specifically, relates to a semiconductor device and a manufacturing method thereof.

DESCRIPTION OF THE RELATED ART

With the rapid development of the information industry, memory has to meet much stricter demands. Phase change random access memory (PCRAM) has become a research hotspot for current memory technologies because of its advantages, such as high-efficient read capability, high erasable times, non-volatility, small unit area, low power consumption, low cost, multi-level storage capability, good anti-seismic performance and anti-radiation capability.

The phase change random access memory uses a material that can change phase (referred to herein as a phase change material) and records data by making use of the characteristic that a phase change in the material produces different electrical resistivity under different states. When the phase change material is in a crystalline state, it has a relatively low resistance; while when the phase change material is in an amorphous state, it has a relatively high resistance. Thus, it is possible to record data by making the phase change material switch between the crystalline phase and the amorphous phase. Additionally, it is also possible to read data by measuring the resistivity of the phase change material.

FIG. 1 schematically shows a structural view of one memory unit in a conventional phase change random access memory.

As shown in FIG. 1, the memory unit mainly includes: a top electrode 160 located in an insulating material layer 150, a bottom electrode 120 located in an insulating material layer 110, and a phase change material layer 130 located between the top electrode 160 and the bottom electrode 120. In the phase change memory unit having the aforementioned structure, the crystalline state of the phase change material layer 130 can be changed under the driving effect of a current pulse.

SUMMARY OF THE INVENTION

A phase change random access memory device is provided in which contact area between the bottom electrode and the phase change material is relatively small, and thus the drive current can be reduced.

According to a first aspect a device includes: a phase change unit that includes a top insulating material layer, a bottom insulating material layer and a phase change material layer positioned between the top insulating material layer and the bottom insulating material layer; and a first sidewall electrode and a second sidewall electrode which are respectively located on two opposite sidewalls of the phase change unit and respectively in contact with two opposite end faces of the phase change material layer.

The phase change material layer may include GeSbTe chalcogenide, and the top insulating material layer and the bottom insulating material layer may include an insulation oxide.

The first sidewall electrode and the second sidewall electrode may include titanium nitride.

The device may further include: a first insulating material layer under the phase change unit; a first conductive plug that penetrates through the first insulating material layer and is electrically connected to the first sidewall electrode; and a second insulating material layer located over the first insulating material layer and flush with a top surface of the phase change unit.

The first sidewall electrode may include a vertical extension portion. The lower end of the vertical extension portion can be electrically connected to the upper end of the first conductive plug.

The first sidewall electrode may include a vertical extension portion and a lateral extension portion. Here, the lower end of the vertical extension portion can be connected to one end of the lateral extension portion and the lateral extension portion is electrically connected to the upper end of the first conductive plug.

The semiconductor device may further include a buried N plus (BNP) layer and a gating diode located over the BNP, where the upper end of the gating diode can be electrically connected to the lower end of the first conductive plug.

The semiconductor device may further include: a third insulating material layer located over the second insulating material layer; and a second conductive plug that penetrates through the third insulating material layer, wherein the lower end of the second conductive plug is electrically connected to the upper end of the second sidewall electrode and the upper end of the second conductive plug is electrically connected to a bit line.

The device may further include a third conductive plug that penetrates through the first insulating material layer, the second insulating material layer and the third insulating material layer. The lower end of the third conductive plug is electrically connected to a doped region on the BNP and the upper end of the third conductive plug is electrically connected to a bit line.

According to another aspect a method of manufacturing a device is provided. The method includes: forming a phase change unit, wherein the phase change unit includes a top insulating material layer, a bottom insulating material layer and a phase change material layer positioned between the top insulating material layer and the bottom insulating material layer; and forming a first sidewall electrode and a second sidewall electrode which are respectively located on the two opposite sidewalls of the phase change unit and respectively in contact with two opposite end faces of the phase change material layer.

Forming the phase change unit may include: depositing a bottom insulating material layer, a phase change material layer and a top insulating material layer in order; and etching the bottom insulating material layer, the phase change material layer and the top insulating material layer to form the phase change unit.

The phase change material layer has may include GeSbTe chalcogenide, and the top insulating material layer and the bottom insulating material layer may include an insulation oxide.

Forming the first sidewall electrode and the second sidewall electrode may include: depositing an electrode layer to cover the top insulating material layer and the sidewalls of the phase change unit; and etching the electrode layer to form the first sidewall electrode and the second sidewall electrode.

The electrode layer may have a material of titanium nitride.

The method may further include: depositing a first insulating material layer before forming the phase change unit; and forming a first conductive plug that penetrates through the first insulating material layer and is electrically connected to the first sidewall electrode.

The first sidewall electrode may include a vertical extension portion. The lower end of the vertical extension portion can be electrically connected to the upper end of the first conductive plug.

The first sidewall electrode may include a vertical extension portion and a lateral extension portion. Here, the lower end of the vertical extension portion can be connected to one end of the lateral extension portion and the lateral extension portion can be electrically connected to the upper end of the first conductive plug.

The method may further include: forming a buried N plus (BNP) layer; and forming a gating diode on the BNP, wherein, the gating diode is located between the first conductive plug and the BNP.

The method may further include: depositing a second insulating material layer on the first insulating material layer, wherein the second insulating material layer is flush with a top surface of the phase change unit; depositing a third insulating material layer on the second insulating material layer; and forming a second conductive plug that penetrates through the third insulating material layer, wherein the lower end of the second conductive plug is electrically connected to the upper end of the second sidewall electrode and the upper end of the second conductive plug is electrically connected to a bit line.

The method may further include: forming a third conductive plug that penetrates through the first insulating material layer, the second insulating material layer and the third insulating material layer, wherein the lower end of the third conductive plug is electrically connected to a doped region on the BNP and the upper end of the third conductive plug is electrically connected to the bit line.

An advantage of the present disclosure resides in that, a connecting manner of sidewall electrode/phase change unit/sidewall electrode is employed as the connecting manner between electrode and phase change material. For this connecting manner, using the present fabrication process can effectively reduce the contact area between electrode and phase change material. The process for manufacturing a sidewall electrode can be easily integrated with the current VIA-LOOP process, which is free of the limitations of photo-etching.

Further features of the present disclosure and advantages thereof will become apparent from the following detailed description of exemplary embodiments with reference to the accompanying drawings.

BRIEF DESCRIPTION OF THE DRAWINGS

The accompanying drawings, which constitute a part of the disclosure, illustrate example embodiments and, together with the description, serve to explain the example embodiments.

The present disclosure can be better understood by reading the following detailed description with reference to the accompanying drawings.

In the accompanying drawings:

FIG. 1 is a structural diagram showing one memory unit in a conventional phase change memory;

FIGS. 2A to 2E schematically illustrate various stages of a process flow of manufacturing a device according to an example embodiment.

Figure 3:
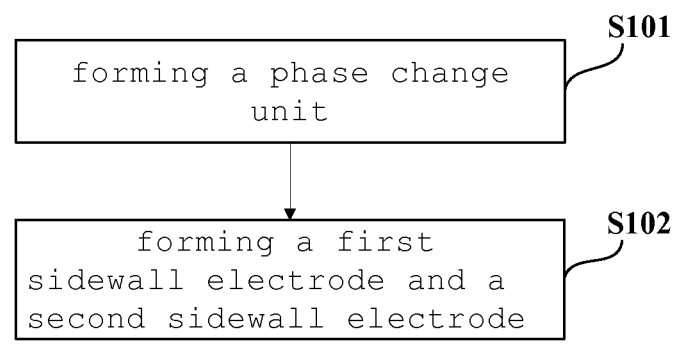

FIG. 3 is a flowchart showing a method of manufacturing a device according to an example embodiment.

FIGS. 4A to 4K schematically illustrate various stages of a process flow of manufacturing a device according to another example embodiment.

Figure 5:
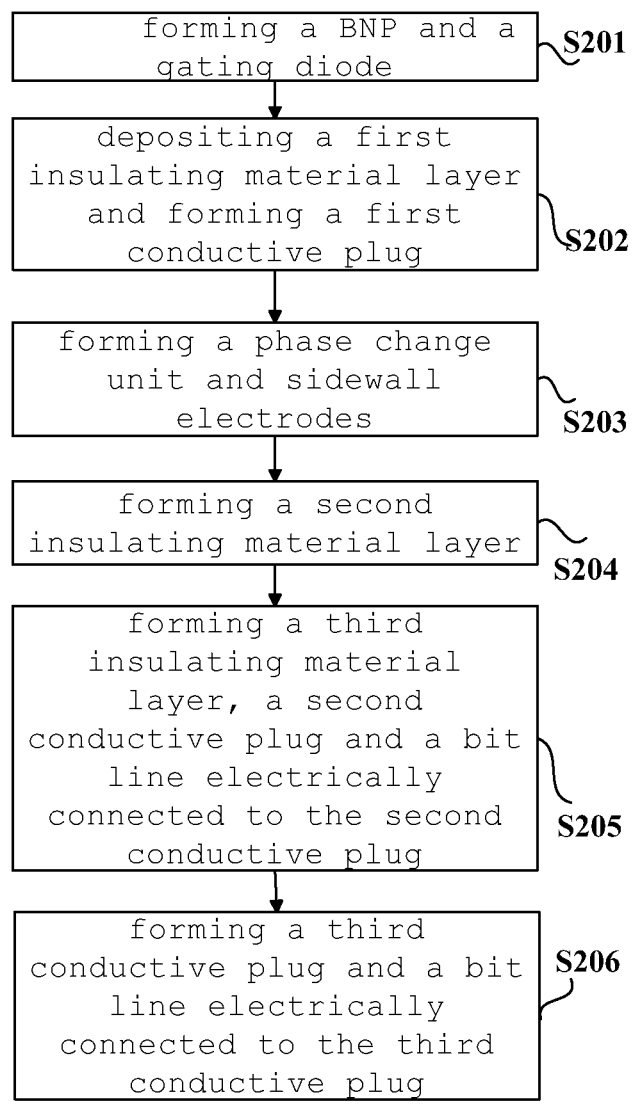

FIG. 5 is a flowchart showing a method of manufacturing a device according to another example embodiment.

DESCRIPTION OF THE EMBODIMENTS

Various example embodiments will now be described in detail with reference to the drawings. It should be noted that the relative arrangement of the components and steps, the numerical expressions, and numerical values set forth in these embodiments do not limit the scope of the present invention unless it is specifically stated otherwise.

It should also be understood that, for the convenience of description, each component in the figures has not been necessarily drawn to scale.

The following description of at least one example embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the embodiments could have different values.

Similar reference numerals and letters refer to similar items in the following figures, and thus once an item is defined in one figure, it is not necessarily further discussed for following figures.

In phase change random access memory units, the smaller a contact area between the phase change material layer, such as phase change material layer and a plug providing the electrical connection to the phase change material, the smaller the drive current required to change the phase.

Figure 1:
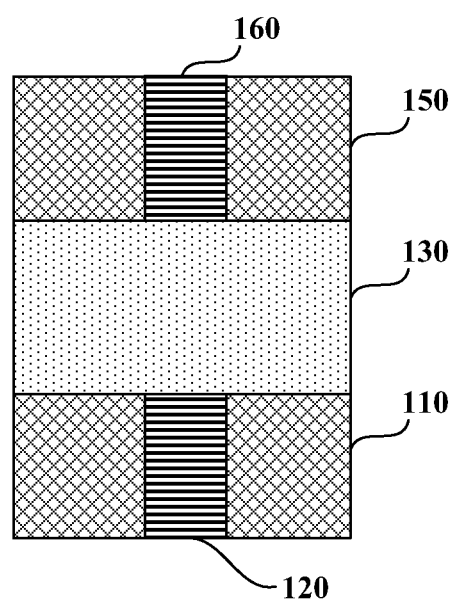

As the level of integration in semiconductor devices has been continuously enhanced, more stringent requirements are posed on minimization of the drive current. It is, however, difficult for the drive current of existing PCRAM devices to meet these requirements. This is because, using the conventional photo-etching technology, the manner in which the top electrode is connected to the phase change material, and the phase change material is connected to bottom electrode in the existing phase change unit, makes it difficult to obtain a relatively small top electrode contact area. For example, the contact size (BEC) between the bottom electrode and the phase change material shown in FIG. 1 and manufactured by using the present photo-etching technology is larger than 70 nm.

Below, with reference to FIGS. 2A to 2E and FIG. 3, a method of manufacturing a device, for instance a semiconductor device, that can be used in a phase change random access memory according to example embodiments will be described. FIG. 3 is a flowchart showing a method of manufacturing such device according to one example embodiment. FIGS. 2A to 2E are cross-sectional views, which schematically illustrate various stages of a particular process flow for implementing the respective steps of FIG. 3 according to one example embodiment. One of ordinary skill in the art will understand that the respective steps of FIG. 3 can also be implemented in other manners.

At step S101, a phase change unit 21 is formed.

The phase change unit 21 includes a top insulating material layer 213, a bottom insulating material layer 211 and a phase change material layer 212 sandwiched between, and in contact with, the top insulating material layer 213 and the bottom insulating material layer 211.

The phase change unit 21 can be formed using the following method.

First, as shown in FIG. 2A, the bottom insulating material 211, the phase change material layer 212 and the top insulating material layer 213 are deposited in order from bottom to top. These various layers can be directly deposited over a semiconductor substrate. Alternatively, as needed, these various layers can be deposited after one or more other material layers or other devices are formed on the semiconductor substrate. In FIG. 2A, the portion below the bottom insulating material layer 211 is not shown.

The material used in the bottom insulating material layer 211 and the top insulating material layer 213 can be any insulating material, for example, insulation oxide or tungsten. In an example embodiment, insulation oxide can be selected as the material used for the bottom insulating material layer and the top insulating material layer. The materials for the bottom insulating material layer 211 and the top insulating material layer 213 can be the same, or they can be different from one another.

The material used in the phase change material layer 212 has the characteristic that a phase change in the material produces different electrical resistivity under different states. For example, the phase change material may have a relatively low resistance when it is in a crystalline state, but have a relatively high resistance when the phase change material is in an amorphous state. The material used for the phase change material layer 212 may be, for example, GeSbTe chalcogenide.

Next, a portion of the aforementioned three material layers are removed by etching, so as to form the phase change unit 21. The phase change unit 21 includes a bottom insulating material layer 214, a phase change material layer 215 and a top insulating material layer 216, as shown in FIG. 2B. Generally, a plurality of phase change units 21 will be formed in a device that can be used as a phase change random access memory. In FIG. 2B, only one phase change unit 21 is shown as an example.

At step S102, a first sidewall electrode 221 and a second sidewall electrode 222 are formed.

The formed first sidewall electrode 221 and second sidewall electrode 222 are respectively located on the two opposite sidewalls of the phase change unit 21 and respectively in contact with two opposite end faces of the phase change material layer 215.

In one example embodiment, the first sidewall electrode 221 and the second sidewall electrode 222 can both be vertical extension portions, as shown in FIG. 2D.

In another example embodiment, the first sidewall electrode 221 can include a vertical extension portion and a lateral extension portion, such as shown in FIG. 2E.

As shown in FIG. 2E, the lower end of the vertical extension portion 225 is connected to one end of the lateral extension portion, forming structures with a "⌐" shape and a "⌙" shape, basically a backward and a forward "L" shape at the bottom of the phase change unit.

The following method can be used for forming the sidewall electrodes as shown in FIGS. 2D and 2E.

First, an electrode layer is deposited to cover the top insulating material layer and the sidewalls of the phase change unit, as shown in FIG. 2C. The deposited electrode layer also covers a layer underlying the phase change unit. The electrode layer comprises a bottom lateral portion 223, a top lateral portion 224 and vertical portions 221 and 222.

The material used in the electrode layer can be, for example, titanium nitride.

Next, a portion of the electrode layer is removed by etching, so as to form a first sidewall electrode and a second sidewall electrode.

In one example, the bottom lateral portion 223 and the top lateral portion 224 that covers the top surface of the phase change unit of the electrode layer can be removed by using a photo/etch (PH/ET) process, so as to form the structure as shown in FIG. 2D.

In another example, the entire top lateral portion 224 and only a portion of the bottom lateral portion 223 of the electrode layer can be removed by using a photo/etch process, so as to form the structure as shown in FIG. 2E. In addition, a portion of the bottom lateral portion 223 at one side of the phase change unit can be maintained while the bottom lateral portion 223 at another side of the phase change unit can be completely removed. The maintained bottom lateral portion can be used to electrically connect the phase change unit to an underlying conductive plug (not shown in FIG. 2E). The contact areas between the first and second sidewall electrodes and the phase change material layer 215 (i.e., the area in which the first and second sidewall (221/222/225) are in direct contact with the phase change material layer 215) depend on a product of the thickness of the phase change layer and the length of the side of the phase change layer at the edge of the phase change unit (e.g. critical size) of the phase change unit formed by a photo/etch process. The thickness of the phase change material layer 215 is determined as a result of the deposition process. It is much easier to deposit a relatively thin phase change material layer than to define a relatively small phase change unit size by photo-etching. Thus, the thickness of the phase change material layer can be much smaller than the critical size.

In contrast, in conventional phase change memory devices, the contact area between the top/bottom electrode and the phase change material is roughly on the order of a square of the critical size (i.e., (critical size)$^2$).

It can be understood that, in one example embodiment, the contact area between the first/second sidewall electrode and the phase change material layer can be a product of the line width (i.e., the length of the phase change unit along the edge of the phase change material layer 215) and the thickness of the phase change material layer.

A structure in which the phase change unit is positioned between two sidewall electrodes can be used to provide the connection between electrode and phase change material. This structure, which is manufactured using the described fabrication process, can effectively reduce the contact area between electrode and phase change material. The process for manufacturing a sidewall electrode can also be easily integrated with the current VIA-LOOP (as will be understood by one of ordinary skill in the art, a via-loop process includes: VIA PH→VIA ET→Glue (such as Ti/TiN) and Metal Dep (such as: tungsten)→CMP) process, which is free of the limitations of photo-etching. For example, the limitation CD of the typical advanced scanner immersion process in 40 nm technology node is about 25~40 nm (for mass production and reliability concern, CD will be larger), but the PVD or CVD can be easily controlled to under 20 nm.

Below, with reference to FIGS. 4A to 4K and FIG. 5, a method of manufacturing a device, for instance a semiconductor device, that can be used for phase change random access memory according to another example embodiment will be described. FIG. 5 is a flowchart showing a method of manufacturing a device that can be used for phase change random access memory according to an example embodiment. FIGS. 4A to 4K schematically illustrate various stages of a particular process flow for implementing the respective steps of FIG. 5 according to one example embodiment. One of ordinary skill in the art will understand that the respective steps of FIG. 5 can also be implemented in other manners.

At step S201, a buried N plus layer ("BNP") 23 and a gating diode 24 are formed (for example an N-doped Epitaxy layer).

Figure 4A:
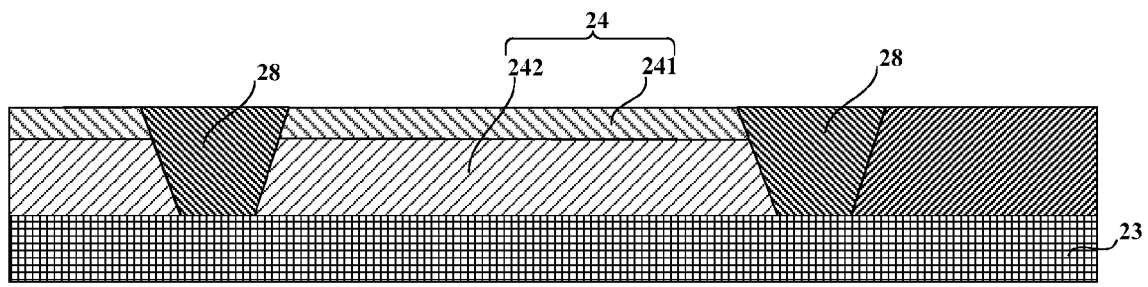

As shown in FIG. 4A, the gating diode 24 is formed on the BNP 23. The gating diode 24 can consist of a P+ doped region 241 and an N– doped region 242. Any one of a number of known isolation materials can be used in here, for example an oxide or low k material.

In addition, several isolation trenches 28 also can be formed. The isolation trenches 28 are filled with insulating medium. The insulating medium filled therein can be, for example, silicon oxide or silicon oxynitride. Additionally, as discussed below, a doped region 243 may be formed over BNP 23.

At step S202, a first insulating material layer 251 is deposited and a first conductive plug 261 is formed.

Figure 4B:
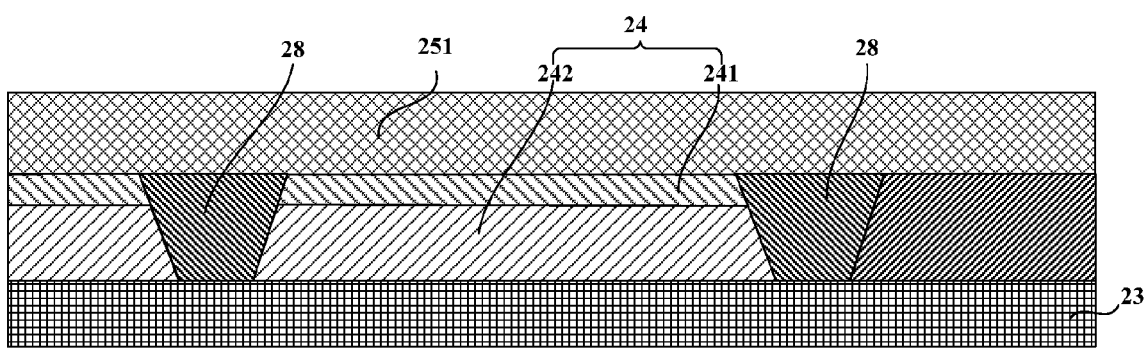

First, a first insulating material layer 251 is deposited over the gating diode 24, as shown in FIG. 4B. The first insulating material layer 251 can be prepared by using, for example, a plasma chemical vapour deposition method, and the material for the first insulating material layer 251 can include, for example, silicon oxide or silicon oxynitride.

Then, a plug hole is formed on the first insulating material layer by using a photo/etch process. In particular, a photo-resist layer is spin-coated over a predefined region of the first insulating material layer. Then, after exposure and development, a pattern of a plug hole is formed. Finally, the first insulating material layer 251 is etched in accordance with the pattern of the plug hole using the photo-resist as a mask, thereby exposing a portion of the P+ doped region 241 of the gating diode 24 and forming a plug hole.

Figure 4C:
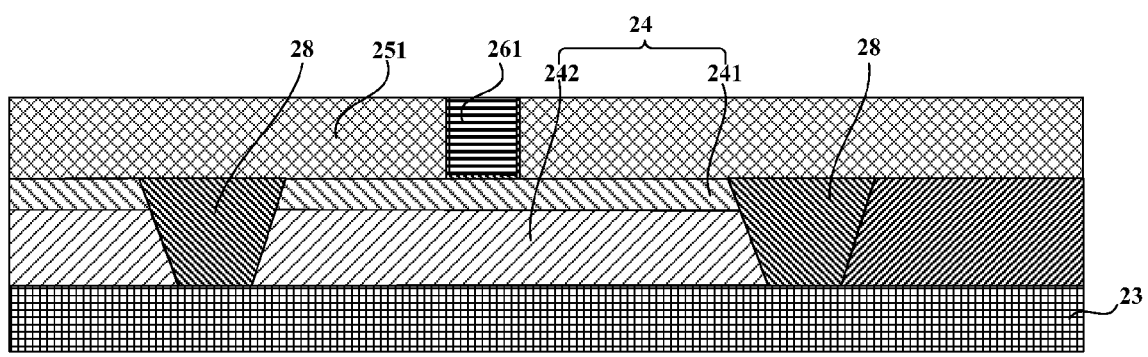

Finally, a conductive material is deposited into the plug hole to form a first conductive plug 261, as shown in FIG. 4C. Conductive material that may remain on the outside the plug hole 261 after it is filled can be removed by using, for example, a chemical mechanical polishing process.

At step S203, a phase change unit and sidewall electrodes are formed.

The process used to form the phase change unit and the sidewall electrodes can be the same as described in the previous embodiment. The method can include a process as follows.

Figure 4D:
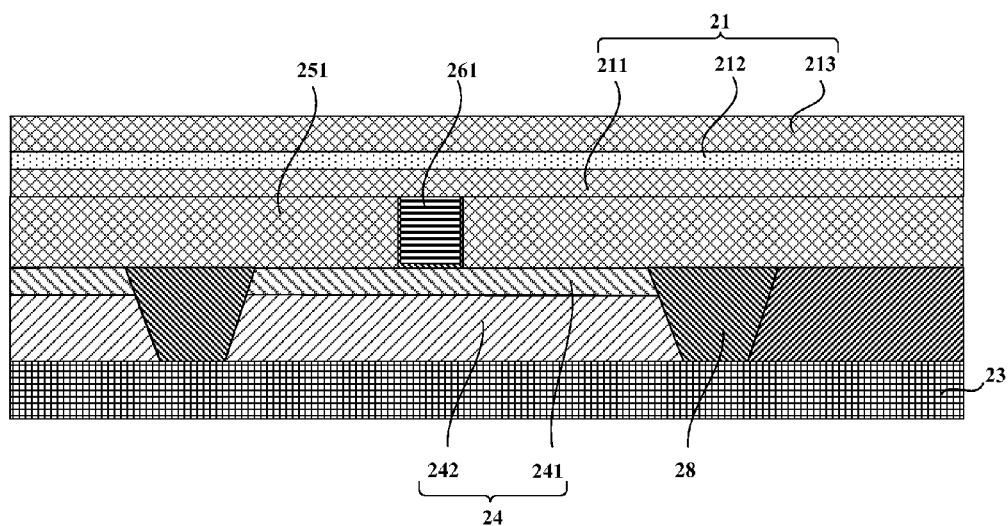

First, a bottom insulating material layer 211, a phase change material layer 212 and a top insulating material layer 213 are deposited in order over the first insulating material layer 251, as shown in FIG. 4D.

The material used in the two insulating material layers can be m, for example, insulation oxide. Here, the materials for the bottom insulating material layer 211 and the top insulating material layer 213 can be the same or can be different from one another. The material used in the phase change material layer 212 has the characteristic that a phase change in the material produces different electrical resistivity under different states. For example, the phase change material may have a relatively low resistance when it is in a crystalline state, but have a relatively high resistance when the phase change mate-rial is in an amorphous state. The material used for the for the phase change material layer 212 can be, for example, GeSbTe chalcogenide, and for example, can be GeSbTe, N—Ge—Sb—Te, As—Sb—Te or In—Sb—Te.

Figure 4E:
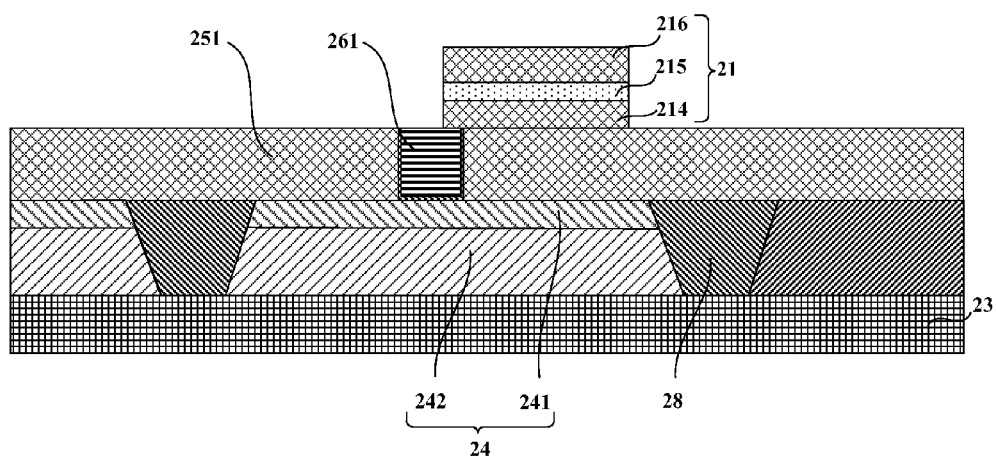

Next, a portion of the aforementioned three material layers are removed by etching, so as to form the phase change unit 21. The formed phase change unit 21 includes a bottom insulating material layer 214, a phase change material layer 215 and a top insulating material layer 216. The phase change unit 21 can be positioned on the first insulating material layer 251 so also to cover a portion of the upper surface of the first conductive plug 261, as shown in FIG. 4E. That is, a portion of the bottom insulating material layer 214 of the phase change unit 21 can contact the conductive material used for the conductive plug 261

Figure 4F:
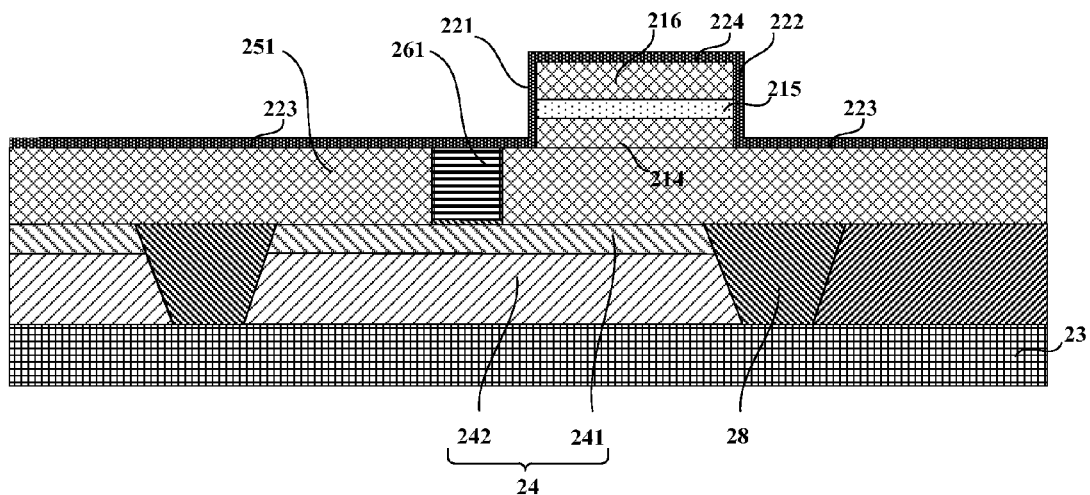

Next, an electrode layer is deposited, which includes a top lateral portion 224, a bottom lateral portion 223 and vertical portions 221 and 222, as shown in FIG. 4F.

The material used for the electrode layer may be, for example, TiN.

Finally, a portion of the electrode layer is removed, so as to form a first sidewall electrode and a second sidewall electrode.

Figure 4G:
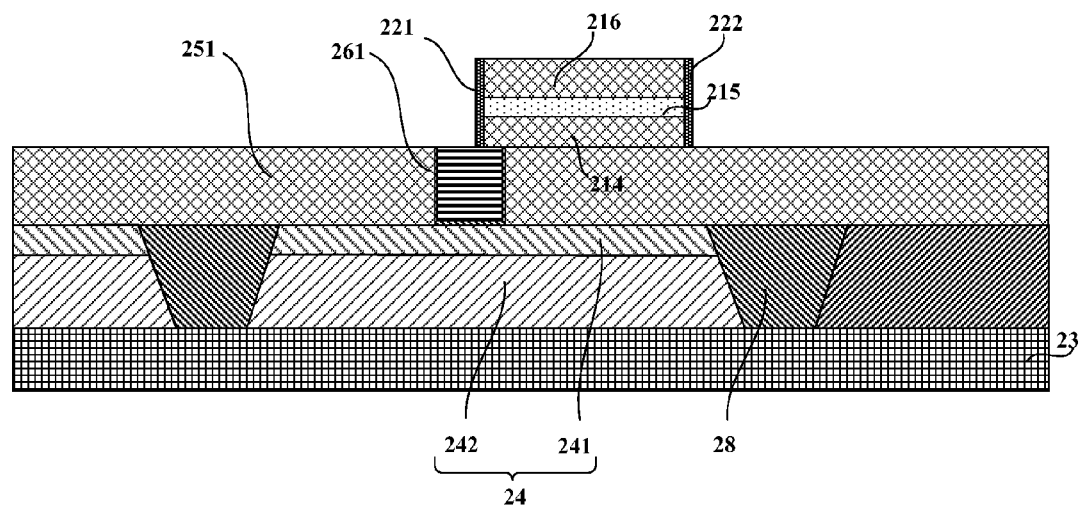

In particular, in one example embodiment, the top lateral portion 224 covering the top surface of the phase change unit and the bottom lateral portion 223 covering the first insulating material layer can be removed by using a photo/etch (PH/ET) process, while the vertical portions 221 and 222 at the two sides of the phase change unit are maintained. In this way, the formed two sidewall electrodes both are vertical extensions, as shown in FIG. 4G.

Figure 4H:
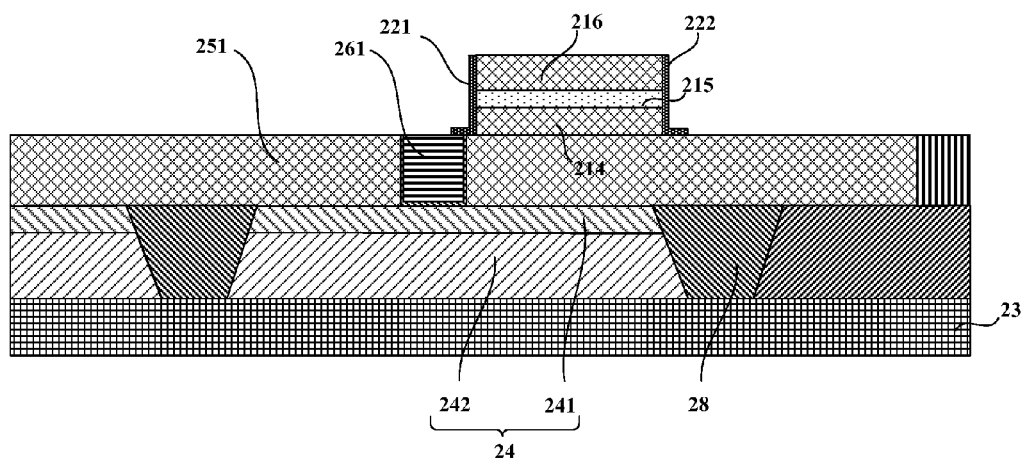

In another example embodiment, a portion of the bottom lateral portion 223 covering the first insulating material layer 251 and the vertical portions 221 and 222 at the two sides of the phase change unit 21 can be maintained, so as to form the structure as shown in FIG. 4H. In FIG. 4H, the first sidewall electrode 225 includes a vertical extension portion, along the sidewall of the phase change unit 21, and a lateral extension portion, along the top of the first insulating material layer 251. The second sidewall electrode 222 can include only a vertical extension portion, or can include both a vertical extension and a lateral extension portion as the first sidewall electrode 225. FIG. 4H shows the case where the second sidewall electrode 222 has a lateral extension.

Because the first sidewall electrode 225 in FIG. 4H includes a lateral extension portion, this lateral extension keeps an electrical connection with a connector that is positioned underneath the lateral extension portion. In this way, the positions of the phase change unit 21 and the first sidewall electrode 225 can be flexibly adjusted as needed. For example, the phase change unit is not limited to being provided so that a portion is directly above and in contact with the first conductive plug 261, and may be, as shown in FIG. 4H, positioned away from the first conductive plug 261, so that the bottom insulating material layer 214 is not in contact the conductive material used for the conductive plug 261. The first sidewall electrode 225 can be provided with, for example, a relatively long lateral extension portion, such that the phase change unit 21 and the first conductive plug 261 can have a relatively long distance therebetween. Providing a distance between the conductive plug 261 and the phase change unit 21 may also help to achieve a better electrical connection between the first sidewall electrode 225 and the first conductive plug 261.

At step S204, a second insulating material layer is formed.

First, the second insulating material layer 252 can be deposited over the first insulating material layer 251.

Figure 4I:
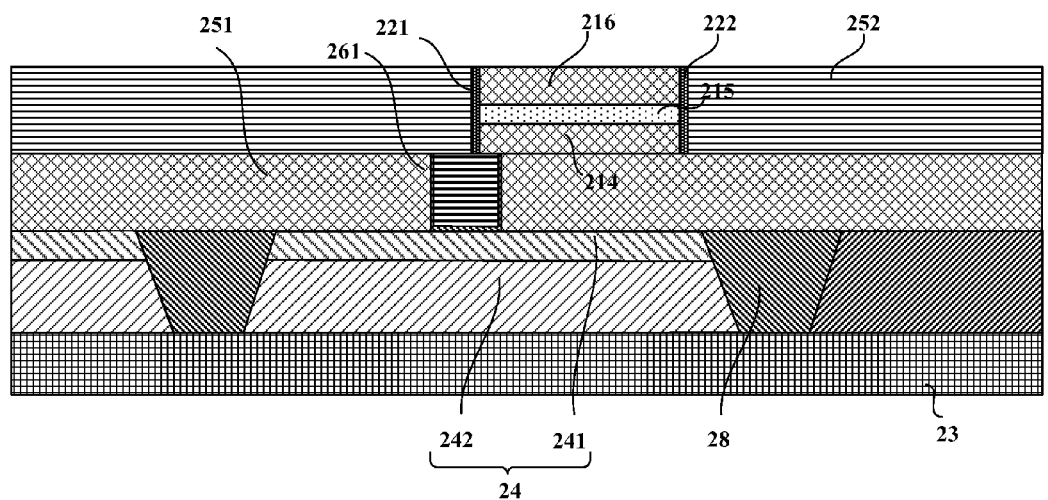

Then, the second insulating material layer 252 can be subjected to a polarization processing using a chemical mechanical polishing (CMP) method, such that the upper surface of the second insulating material layer 252 is flush with the upper surface of the top insulating material layer 216, as shown in FIG. 4I.

Figure 4J:
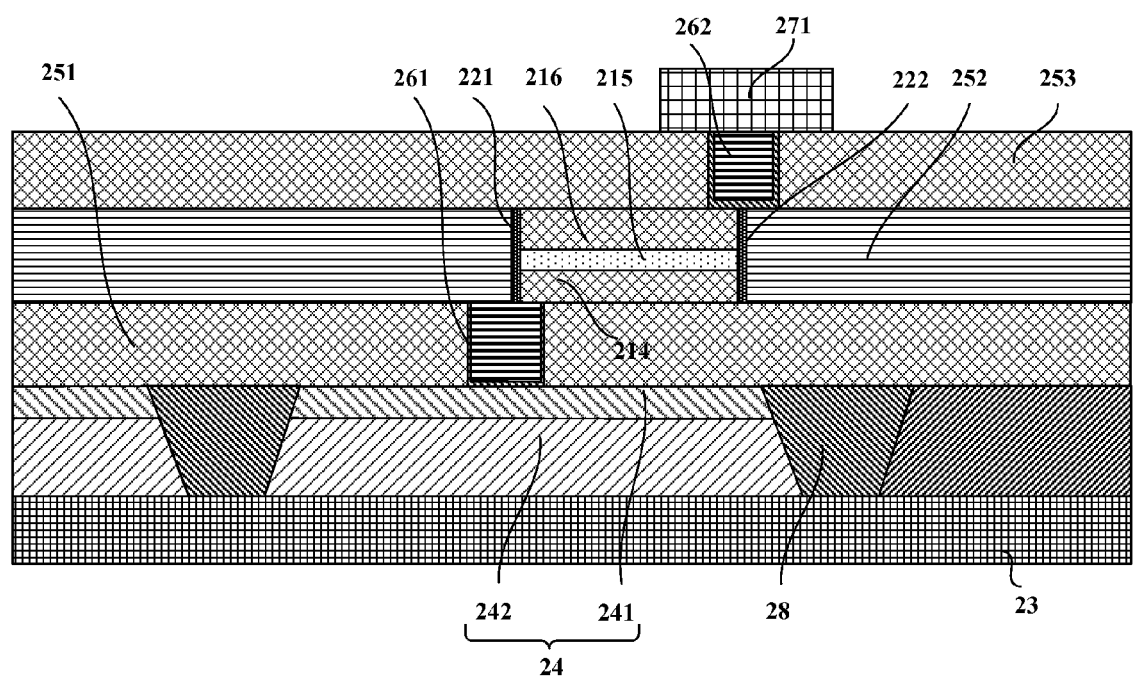

At step S205, a third insulating material layer 253, a second conductive plug 262 and a bit line 271 electrically connected to the second conductive plug 262 are formed, as shown in FIG. 4J.

First, a third insulating material layer 253 can be deposited over the second insulating material layer 252.

Then, the third insulating material layer 253 can be etched by using a photo/etch process, so as to form a hole located over the second sidewall electrode 222, wherein, the hole penetrates through the third insulating material layer 253.

Next, a conductive material is deposited into the hole to form a second conductive plug 262.

Finally, the bit line 271 can be formed over the second conductive plug 262 such that the bit line 271 is electrically connected to the top of the second conductive plug 262.

At step S206, a third conductive plug 263 and a bit line 272 electrically connected to the third conductive plug 263 are formed.

In particular, a hole penetrating through the first insulating material layer 251, the second insulating material layer 252 and the third insulating material layer 253 can be formed by using a photo/etch process.

Then, a conductive material is deposited into the hole to form a third conductive plug 263.

Figure 4K:
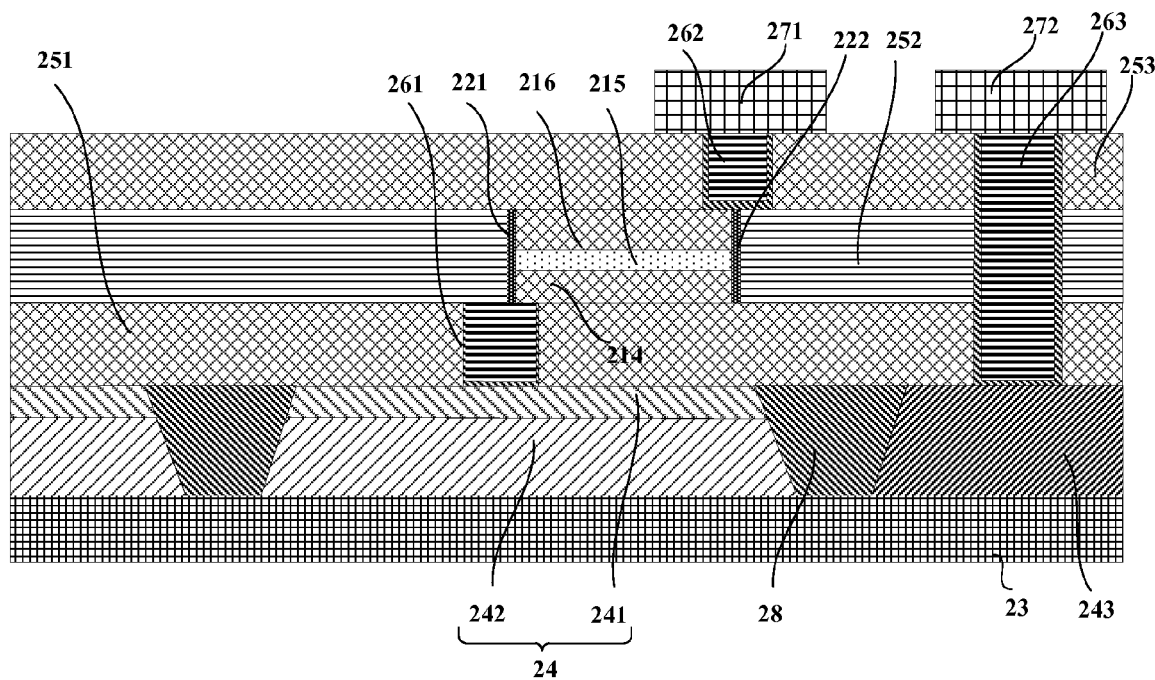

Finally, the bit line 272 can be formed over the third conductive plug 263 such that the bit line 272 is electrically connected to the third conductive plug 263, as shown in FIG. 4K.

Below, with reference to FIGS. 2D and 2E, a structure of a device, for instance a semiconductor device, that can be used for phase change random access memory and manufactured by the method according to the example embodiments will be described.

The device includes a phase change unit 21, a first sidewall electrode 221 and a second sidewall electrode 222.

The phase change unit 21 comprises a top insulating material layer 216, a bottom insulating material layer 214 and a phase change material layer 215. Here, the phase change material layer 215 is sandwiched between, and is in contact with, the top insulating material layer 216 and the bottom insulating material layer 214.

The first sidewall electrode 221 and the second sidewall electrode 222 are respectively located on the two sidewalls of the phase change unit and respectively in contact with two opposite end faces of the phase change material layer 215.

The material used to form the bottom insulating material layer 214 and the top insulating material layer 216 can be, for example, an insulation oxide. The material used in the phase change material layer 215 can be, for example, GeSbTe chalcogenide.

The materials used to form the first sidewall electrode 221 and the second sidewall electrode 222 can include, for example, titanium nitride.

The contact area between the first and second sidewall electrodes 221 and 222 and the phase change material layer 215 is a product of the line width (i.e., the length of the phase change unit along the edge of the phase change material layer 215) and the thickness of the phase change material layer 215.

In one example embodiment, the first sidewall electrode 221 and the second sidewall electrode 222 both include a vertical extension portion, as shown in FIG. 2D.

In another example embodiment, the first sidewall electrode 221 and the second sidewall electrode 222 both include a vertical extension portion, along the sidewalls of phase change unit 21, and a lateral extension portion, along a top of the first insulating material layer 251. The first sidewall electrode 221 has a "⌐" shape and the second sidewall electrode 222 has a "⌐" shape, as shown in FIG. 2E.

Below, with reference to FIG. 4K, a structure of a device, for instance a semiconductor device, that can be used for phase change random access memory and manufactured by the method according the example embodiments will be described.

A gating diode 24 is formed over the BNP 23.

A first insulating material layer 251 and a first conductive plug 261 that penetrates through the first insulating material layer 251 are formed on the gating diode 24.

A phase change unit 21, a first sidewall electrode 221 and a second sidewall electrode 222 are formed on the first insulating material layer 251. Here, the structures of the phase change unit 21, the first sidewall electrode 221 and the second sidewall electrode 222 are the same as the structures described above. The first sidewall electrode 221 and the second sidewall electrode 222 can be vertical extension portions. In another embodiment, the first sidewall electrode 221 and the second sidewall electrode 222 can include a vertical extension portion and a lateral extension portion, whose shapes are "⌐" and "⌐", respectively.

A second insulating material layer 252 is also formed on the first insulating material layer 251. The top surface of the second insulating material layer 252 is flush with the top surface of the phase change unit.

A third insulating material layer 253 and a second conductive plug 262 that penetrates through the third insulating material layer 253 are formed on the second insulating material layer 252.

A bit line 271 is formed over the second conductive plug 262. The bit line 271 is electrically connected to the top of the second conductive plug 262.

The device can further include a third conductive plug 263 that penetrates through the first insulating material layer 251, the second insulating material layer 252 and the third insulating material layer 253. The lower end of the third conductive plug 263 is electrically connected to, and contacts, a doped region 243 over the BNP 23.

A bit line 272 is formed over the third conductive plug 263. The bit line 272 is electrically connected to the third conductive plug 263.

A method of manufacturing a device, for instance a semiconductor device, that can be used for phase change random access memory, as well as the device manufactured by the method, have been described. Certain details that are known to those of relevant skill in the art are not described.

Although some specific embodiments have been demonstrated in detail with examples, it should be understood by one of ordinary skill in the relevant art that the above examples are only intended to be illustrative, and are not intended to limit the scope of the present invention. It should be understood by one of ordinary skill in the relevant art that the above embodiments can be modified without departing from the scope and spirit of the present disclosure, including the attached claims.

What is claimed is:

1. A device comprising:
   a phase change unit that includes a top insulating material layer, a bottom insulating material layer and a phase change material layer positioned between the top insulating material layer and the bottom insulating material layer;
   a first sidewall electrode and a second sidewall electrode which are respectively located on two opposite sidewalls of the phase change unit and respectively in contact with two opposite end faces of the phase change material layer,
   a first insulating material layer under the phase change unit;
   a first conductive plug that penetrates through the first insulating material layer and is electrically connected to the first sidewall electrode; and
   a second insulating material layer located over the first insulating material layer and flush with a top surface of the phase change unit.

2. The device of claim 1, wherein the phase change material layer includes GeSbTe chalcogenide, and the top insulating material layer and the bottom insulating material layer include an insulation oxide.

3. The device of claim 1, wherein the first sidewall electrode and the second sidewall electrode include titanium nitride.

4. The semiconductor device of claim 1, wherein the first sidewall electrode includes a vertical extension portion including a lower end that is electrically connected to an upper end of the first conductive plug.

5. The device of claim 1, wherein the first sidewall electrode includes a vertical extension portion and a lateral extension portion, wherein the lower end of the vertical extension portion is connected to one end of the lateral extension portion and the lateral extension portion is electrically connected to an upper end of the first conductive plug.

6. The device of claim 1, further comprising a buried N plus (BNP) layer and a gating diode located over the BNP, wherein the upper end of the gating diode is electrically connected to the lower end of the first conductive plug.

7. The device of claim 1, further comprising:
   a third insulating material layer located over the second insulating material layer; and
   a second conductive plug that penetrates through the third insulating material layer, wherein a lower end of the second conductive plug is electrically connected to an upper end of the second sidewall electrode and an upper end of the second conductive plug is electrically connected to a bit line.

8. The device of claim 7, further comprising a third conductive plug that penetrates through the first insulating material layer, the second insulating material layer and the third insulating material layer, wherein the lower end of the third conductive plug is electrically connected to a doped region on the BNP and the upper end of the third conductive plug is electrically connected to a bit line.

9. A method of manufacturing a device comprising:
   forming a phase change unit, wherein the phase change unit includes a top insulating material layer, a bottom insulating material layer and a phase change material layer positioned between the top insulating material layer and the bottom insulating material layer;
   forming a first sidewall electrode and a second sidewall electrode which are respectively located on the two opposite sidewalls of the phase change unit and respectively in contact with two opposite end faces of the phase change material layer,
   depositing a second insulating material layer on the first insulating material layer, wherein the second insulating material layer is flush with a top surface of the phase change unit;
   depositing a third insulating material layer on the second insulating material layer; and
   forming a second conductive plug that penetrates through the third insulating material layer, wherein a lower end of the second conductive plug is electrically connected to an upper end of the second sidewall electrode and an upper end of the second conductive plug is electrically connected to a bit line.

10. The method of claim 9, the method further comprising:
    forming a third conductive plug that penetrates through the first insulating material layer, the second insulating material layer and the third insulating material layer, wherein a lower end of the third conductive plug is electrically connected to a doped region on the BNP and an upper end of the third conductive plug is electrically connected to the bit line.

11. The method of claim 9, wherein forming the phase change unit comprises:
    depositing a bottom insulating material layer, a phase change material layer and a top insulating material layer in order; and
    etching the bottom insulating material layer, the phase change material layer and the top insulating material layer to form the phase change unit.

12. The method of claim 11, wherein the phase change material layer includes GeSbTe chalcogenide, and the top insulating material layer and the bottom insulating material layer include an insulation oxide.

13. The method of claim 9, wherein forming the first sidewall electrode and the second sidewall electrode comprises:
    depositing an electrode layer to cover the top insulating material layer and the sidewalls of the phase change unit; and
    etching the electrode layer to form the first sidewall electrode and the second sidewall electrode.

14. The method of claim 13 wherein the electrode layer includes titanium nitride.

15. The method of claim 9, the method further comprising:
    depositing a first insulating material layer before forming the phase change unit; and
    forming a first conductive plug that penetrates through the first insulating material layer and is electrically connected to the first sidewall electrode.

16. The method of claim 15, wherein the first sidewall electrode includes a vertical extension portion, and a lower end of the vertical extension portion is electrically connected to an upper end of the first conductive plug.

17. The method of claim 15, wherein the first sidewall electrode includes a vertical extension portion and a lateral extension portion, wherein a lower end of the vertical extension portion is connected to one end of the lateral extension portion and the lateral extension portion is electrically connected to an upper end of the first conductive plug.

18. The method of claim 15, the method further comprising:
    forming a buried N plus (BNP) layer; and
    forming a gating diode on the BNP, wherein, the gating diode is located between the first conductive plug and the BNP.

* * * * *